United States Patent
Bruin

(10) Patent No.: US 8,289,077 B2
(45) Date of Patent: Oct. 16, 2012

(54) SIGNAL PROCESSOR COMPRISING AN AMPLIFIER

(75) Inventor: Paulus P. F. M. Bruin, Nijmegen (NL)

(73) Assignee: NXP B.V., Eindhoven (NL)

( * ) Notice: Subject to any disclaimer, the term of this patent is extended or adjusted under 35 U.S.C. 154(b) by 97 days.

(21) Appl. No.: 12/742,289

(22) PCT Filed: Nov. 7, 2008

(86) PCT No.: PCT/IB2008/054667
§ 371 (c)(1),
(2), (4) Date: May 11, 2010

(87) PCT Pub. No.: WO2009/063373
PCT Pub. Date: May 22, 2009

(65) Prior Publication Data
US 2010/0253432 A1    Oct. 7, 2010

(30) Foreign Application Priority Data

Nov. 12, 2007 (EP) .................................. 07120440

(51) Int. Cl.
*H03F 3/45* (2006.01)
(52) U.S. Cl. ........................................ 330/253; 330/258
(58) Field of Classification Search .................. 330/253, 330/258, 260
See application file for complete search history.

(56) References Cited

U.S. PATENT DOCUMENTS

| | | | |
|---|---|---|---|
| 4,021,751 A | 5/1977 | Suzuki | |
| 6,466,093 B1 | 10/2002 | Yan | |
| 6,696,894 B1 * | 2/2004 | Huang | 330/253 |
| 7,564,272 B2 * | 7/2009 | Park | 327/89 |

FOREIGN PATENT DOCUMENTS

| | | | |
|---|---|---|---|
| GB | 2 307 610 A | 5/1997 | |
| WO | 2005/104356 A1 | 11/2005 | |

OTHER PUBLICATIONS

Huijsing, Johan H., et al; "Low-Power Low-Voltage VLSI Operational Amplifier Cells"; IEEE Trans. on Circuits and Systems, vol. 42, No. 11, pp. 841-852 (Nov. 1995) also published as Hogervorst, R., et al; "Low-power low-voltage VLSI Operational amplifier cells", Section 1.1.2.2, Voltage-Efficient Input Stages, pgs. 19-47, (Jan. 1, 1996).

International Search Report and Written Opinion for International Patent Appln. PCT/IB2008/054667 (May 8, 2009).

\* cited by examiner

*Primary Examiner* — Steven J Mottola

(57) ABSTRACT

An amplifier (A1) within a signal processor comprises a pair of complementary differential pairs (DP1, DP2) in the sense that one differential pair comprises transistors having a polarity opposite to that of transistors in the other differential pair. The one and the other differential pair commonly receive a differential input signal, which has a common mode component. A current combining circuit (CC) combines output currents of the one and the other differential pair so as to obtain an output current that varies as a function of the differential input signal. The one and the other differential pair each have a biasing circuit (R1, R2), which provides a tail current that varies with the common mode component in a substantially linear fashion.

20 Claims, 2 Drawing Sheets

A1

SIGNAL PROCESSOR COMPRISING AN AMPLIFIER

FIELD OF THE INVENTION

An aspect of the invention relates to a signal processor that includes an amplifier, which comprises a pair of complementary differential pairs coupled to commonly receive a differential input signal. The signal processor may be implemented in the form of, for example, an integrated circuit. Another aspect of the invention relates to a signal rendering system.

BACKGROUND OF THE INVENTION

The article entitled "Low-Power Low-Voltage VLSI Operational Amplifier Cells" by Johan H. Huijsing et al., published in IEEE Transactions on Circuits and Systems, Vol. 42, No. 11, November 1995, describes voltage-efficient input stages (section II). The following considerations are made. A P-channel differential CMOS input stage has a common mode input voltage range that extends from a negative rail voltage up to a positive rail voltage minus a gate-source voltage $V_{GS}$ and a saturation voltage $V_{Dsat}$ of a tail-current source. A N-channel differential CMOS input stage has a common mode input voltage range that extends from the positive rail voltage down the negative rail voltage plus the gate-source voltage $V_{GS}$ and the saturation voltage $V_{Dsat}$ of a tail-current source. In case a so-called rail-to-rail input range is required, the aforementioned differential input stages, which are complementary, should be combined and at least one of the stages should function. FIG. 2 of the article illustrates such a topology. A summing circuit adds respective output currents of the differentials input stages. The summing circuit comprises four transistors $M_5$-$M_8$ that function as two folded current followers, while a pair $M_6$, $M_8$, simultaneously functions as a current mirror.

SUMMARY OF THE INVENTION

It is an object of the invention to provide a signal processor that allows signals that have a relatively large voltage swing to be processed with relatively low distortion. The independent claims define various aspects of the invention. The dependent claims define additional features for implementing the invention to advantage.

The invention takes the following points into consideration. The prior-art topology described hereinbefore will produce an output signal that is distorted to relatively great extent, in particular if a common mode input signal with a relatively large voltage swing is present. This large signal distortion is related to the following aspects. In practice, the prior-art topology will produce an offset output current, which is due to imbalance in the differential input stages. The offset output current varies as a function of tail currents within differential input stages. Consequently, any modulation of such a tail current will result in a corresponding modulation of the offset output current. In order to prevent tail current modulation, tail current sources are generally implemented by means of transistors. Such implementations allow relatively high common-mode rejection ratios: a common mode input signal will be suppressed to relatively great extent.

However, a tail current source with transistors typically provides a substantially constant tail current, except in a voltage range where a relatively small voltage is present across the tail current source. In this voltage range, the tail current will vary with the voltage across the tail current source to relatively great extent, which is due to saturation effects. As a result, there is a tail current modulation characteristic, which may indeed be negligible when common-mode voltages are confined in a relatively small range somewhere half way between signal ground and a supply voltage. However, the tail current modulation characteristic is non-negligible and, moreover, substantially nonlinear when common mode voltages vary in a relatively large range between signal ground and the supply voltage. Accordingly, a common mode input signal with a relatively large voltage swing, which nearly reaches signal ground and the supply voltage, will cause a substantially nonlinear tail current modulation and, as a result, a corresponding nonlinear modulation of the offset output current. This nonlinear modulation, which occurs when relatively large common mode input signals are present, will produce a significant distortion component.

In accordance with the invention, an amplifier within a signal processor comprises a pair of complementary differential pairs in the sense that one differential pair comprises transistors having a polarity opposite to that of transistors in the other differential pair. The one and the other differential pair commonly receive a differential input signal, which has a common mode component. A current combining circuit combines output currents of the one and the other differential pair so as to obtain an output current that varies as a function of the differential input signal. The one and the other differential pair each have a biasing circuit, which provides a tail current that varies with the common mode component in a substantially linear fashion.

Accordingly, a common mode component will cause a tail current modulation that is substantially linear over a relatively large voltage range. As a result, the common mode component will correspondingly modulate the offset output current in a substantially linear fashion. This prevents a significant distortion component from occurring in the output current. In this respect, it should be noted that the common mode component may modulate the offset output current to relatively large extent, which is synonym to a relatively poor common mode rejection ratio. This is not a problem from a distortion point of view. What matters is that any modulation of the offset output current is substantially linear, which the invention achieves over a relatively large voltage range. For those reasons, the invention allows signals that have a relatively large voltage swing to be processed with relatively low distortion.

Another advantage of the invention relates to the following aspects. In principle, it is possible to reduce distortion by reducing the imbalance in the pair of complementary differential pairs. The smaller the imbalance is, the smaller the offset output current is. The smaller the offset output current is, the smaller the distortion component is for a given tail current modulation characteristic. The tail current modulation characteristic is substantially linear in an amplifier according to the invention, whereas the tail current modulation characteristic is substantially nonlinear in the prior art amplifier. Consequently, an amplifier according to the invention can tolerate a significantly greater degree of imbalance than the prior art amplifier, if a given distortion requirement should be met. Stated otherwise, the prior art amplifier tolerates only a relatively small degree of imbalance from a distortion point of view. Achieving a relatively small degree of imbalance requires relatively precise manufacturing techniques or relatively large components, or both, which entails relatively high cost. Since an amplifier in accordance with the invention tolerates a relatively great degree of imbalance, the invention allows low-cost implementations.

An implementation of the invention advantageously comprises one or more of following additional features, which are described in separate paragraphs that correspond with individual dependent claims.

In each aforementioned differential pair, the biasing circuit that provides the tail current is preferably in the form of a resistance. This further contributes to achieving a relatively low distortion at modest cost.

The current combining circuit preferably comprises a pair of current-inverting buffers. Each current-inverting buffer comprises an input node that is coupled to a first supply voltage line via a biasing circuit for applying a bias current to the input node. The one and the other current-inverting buffer receive an output current and a complementary output current, respectively, of one differential pair at their respective input nodes. The current combining circuit further comprises a current mirror for mirroring an output current of one current-inverting buffer. The current mirror comprises an input branch and an output branch, each branch including a transistor having a main terminal that is coupled to a second supply voltage line via an impedance. The input branch and the output branch receive an output current and a complementary output current, respectively, of the other differential pair at the respective main terminals of the respective transistors. An output node receives an output current of the other current-inverting buffer and an output current of the current mirror. These features further contribute to achieving low distortion for relatively large input signals.

In each aforementioned current-inverting buffer, the biasing circuit that applies the bias current to the input node is preferably in the form of a resistance. This further contributes to achieving to achieving low distortion for relatively large input signals.

Each aforementioned current-inverting buffer comprises preferably comprises a transistor having a control terminal coupled to receive a bias voltage and a main terminal that constitutes the input node of the current-inverting buffer.

The transistors may be of the CMOS type.

The amplifier may be provided with a feedback circuit so that the differential input signal represents a difference between an input signal and an output signal of the amplifier.

A detailed description with reference to drawings illustrates the invention summarized hereinbefore, as well as the additional features.

DETAILED DESCRIPTION OF THE EMBODIMENTS

Figure 1:
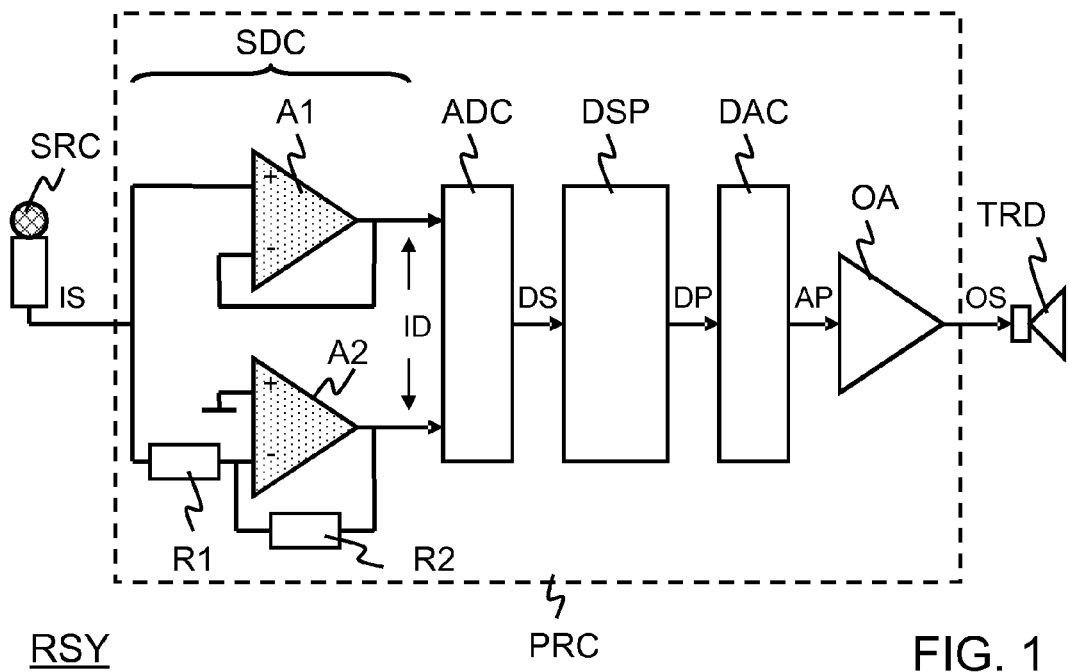
FIG. 1 is a block diagram that illustrates a signal rendering system, which comprises a signal processor.

FIG. 1 illustrates a signal rendering system RSY that comprises a signal source SRC, a signal processor PRC, and a signal transducer TRD. The signal source SRC may be in the form of, for example, a microphone. The signal transducer TRD may be in the form of, for example, a loudspeaker. The signal processor PRC may be implemented in the form of, for example, an integrated circuit.

In more detail, the signal processor PRC comprises a single-ended to differential converter SDC, an analog-to-digital converter ADC, a digital signal processor DSP, a digital to analog converter DAC, and an output amplifier OA. The single-ended to differential converter SDC comprises two amplifiers A1, A2. Each amplifier has an inverting input +, a non-inverting input −, and an output. Amplifiers A1 operates as a non-inverting buffer by means of a short circuit between the output and the inverting input. This amplifier A1 will be referred to as non-inverting amplifier A1 hereinafter. The non-inverting amplifier A1 constitutes a so-called voltage follower. Amplifier A2 operates as an inverting buffer by means of a feedback network that comprises two resistances, which are substantially equal. This amplifier A2 will be referred to as inverting amplifier hereinafter.

The signal rendering system RSY basically operates as follows. The signal source SRC applies an input signal IS to the signal processor PRC. The single-ended to differential converter SDC converts the input signal IS, which is single-ended, into a differential input signal ID. The analog-to-digital converter ADC converts the differential input signal ID into a digital signal DS. The digital signal processor DSP processes this digital signal DS so as to provide a processed digital signal DP, which the digital-to-analog converter DAC converts into an analog processed signal AP. The output amplifier OA amplifies the analog processed signal AP so as to obtain an output signal OA, which is applied to the signal transducer TRD.

The non-inverting amplifier A1 will provide an output signal that is substantially equal to the input signal IS. A differential signal of relatively small magnitude will be present between the non-inverting input − and the inverting input + of the non-inverting amplifier A1. However, this differential signal may have a common mode component of relatively large magnitude. The common mode component corresponds with the input signal IS, which may have a relatively large amplitude. A relatively large amplitude allows an effective use of the analog-to-digital converter ADC in terms of resolution. This contributes to achieving a relatively good signal to noise ratio.

For example, let it be assumed that the analog to digital converter ADC provides a minimum digital value when the amplitude of the input signal IS is relatively close to signal ground, and a maximum digital value when the amplitude of the input signal IS is relatively close to a supply voltage, which the signal processor PRC receives. That is, it is assumed that the analog to digital converter ADC has a so-called rail-to-rail dynamic voltage range. In that case, the input signal IS preferably has a corresponding voltage swing, which nearly reaches signal ground and nearly reaches the supply voltage. The non-inverting amplifier A1 should have a similar dynamic voltage range in order to cope with this voltage swing. That is, the non-inverting amplifier A1 should operate in a distortion free manner when the input signal IS varies in a voltage range comprised between a minimum level that is near to signal ground and a maximum level that is near to the supply voltage.

Figure 2:
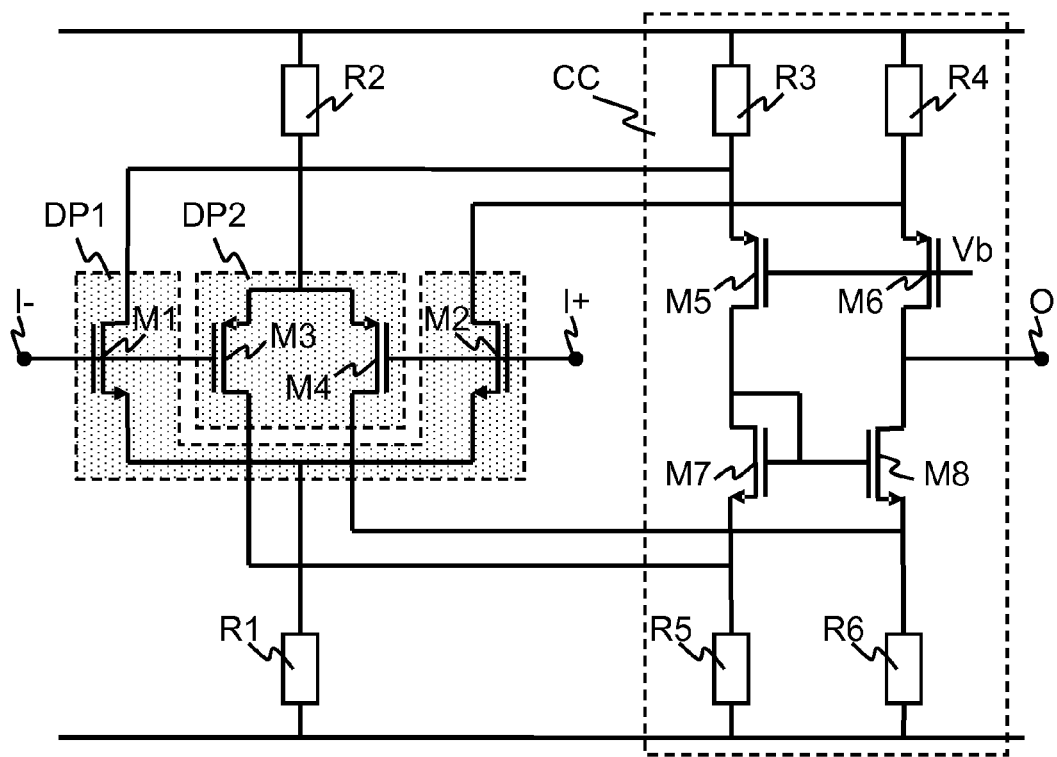
FIG. 2 is a circuit diagram that illustrates an amplifier, which forms part of the signal processor.

FIG. 2 illustrates the non-inverting amplifier A1. The inverting amplifier has a similar structure. The non-inverting amplifier A1 comprises various transistors M1-M8 and various resistances R1-R5. Each transistor has a gate, a source, and a drain. The gate constitutes a control terminal. The source and the drain constitute respective main terminals of the transistor concerned.

More specifically, the non-inverting amplifier A1 comprises a pair of complementary differential pairs DP1, DP2. The differential pairs DP1, DP2 are complementary in the sense that differential pair DP1 comprises transistors of the NMOS type, whereas differential pair DP2 comprises transistors of the PMOS type. The differential pairs DP1, DP2 will be referred to as NMOS differential pair and PMOS differential pair, respectively, hereinafter. Transistors M1 M2, which belong to the NMOS differential pair, thus have a polarity opposite to that of transistors M3, M4, which belong to the PMOS differential pair.

The NMOS differential pair comprises a common source node that is coupled to signal ground via resistance R1. In a similar fashion, the PMOS differential pair comprises a common node source that is coupled to a supply voltage line via resistance R2. The NMOS differential pair and the PMOS differential pair commonly receive a differential input signal. That is, the respective gates of transistor M1 and transistor M3 are coupled to each other and constitute the inverting input − of the non-inverting amplifier A1. The respective gates of transistor M2 and transistor M4 are coupled to each other and constitute the non-inverting input + of the non-inverting amplifier A1.

The non-inverting amplifier A1 further comprises a current combining circuit CC, which includes transistors M5-M8 and resistances R3-R6. Transistor M5, whose source is coupled to the supply voltage line via resistance R3 and whose gate receives a bias voltage Vb, constitutes a current-inverting buffer. The source constitutes an input of this current-inverting buffer, which is coupled to the drain of transistor M1 of the NMOS differential pair. The drain of transistor M5 constitutes an output of the current-inverting buffer. Similarly, transistor M6, whose source is coupled to the supply voltage via resistance R4 and whose gate receives the bias voltage Vb, constitutes another current-inverting buffer. The source constitutes an input of this other current-inverting buffer, which is coupled to transistor M2 of the NMOS differential pair. The drain constitutes an output of the other current-inverting buffer.

Transistor M7 and transistor M8 constitute a current mirror. More specifically, transistor M7, whose gate and drain are coupled to each other, constitutes an input branch, which further comprises resistance R5. Resistance R5 couples the source of transistor to signal ground. The input branch is coupled to the current-inverting buffer formed by transistor M5. Furthermore, the source of transistor M7 in the input branch is coupled to the drain of transistor M3, which belongs to the PMOS differential pair. Transistor M8 constitutes an output branch, which further comprises resistance R6. Resistance R6 couples the source of transistor M8 to signal ground. The source of transistor M8 in the output branch is coupled to the drain of transistor M4, which belongs to the PMOS differential pair.

The current combining circuit CC has an output node O. The output node O corresponds with an interconnection of the drain of transistor M6 and the drain of transistor M8, which belongs to the output branch of the current mirror.

The non-inverting amplifier A1 basically operates as follows. The NMOS differential pair transforms a differential signal voltage that is present between the inverting input − and the non-inverting input + into a differential signal current. This differential signal current has two complementary components, one of which corresponds with a signal current at the drain of transistor M1, the other component corresponding with a signal current at the drain of transistor M2. The PMOS differential pair also transforms the differential signal voltage into a differential signal current. The differential signal current that the PMOS differential pair provides also has two complementary components, one of which corresponds with a signal current at the drain of transistor M3, the other component corresponding with a signal current at the drain of transistor M4.

The current combining circuit CC effectively combines the respective components of the respective differential signal currents, which the NMOS differential pair and the PMOS differential pair provide. That is, the current combining circuit CC makes a linear combination of the respective signal currents at the respective drains of transistors M1-M4. This linear combination constitutes an output signal current of the non-inverting amplifier A1.

In more detail, the current-inverting buffer formed by transistor M5 and resistance R3 applies an inverted version of the signal current at the drain of transistor M1 to the input branch current mirror, which is formed by transistors M7, M8. Accordingly, the output node O receives an inverted and mirrored version of the signal current at the drain of transistor M1. This constitutes a first output component. The current-inverting buffer formed by transistor M6 and resistance R4 applies an inverted version of the signal current at the drain of transistor M2 to the output node O. This constitutes a second output component.

The input branch of the current mirror receives the signal current at the drain of transistor M3 at the source of transistor M7 within the input branch. Accordingly, the output node O receives a mirrored version of the signal current at the drain of transistor M3. This constitutes a third output component. The output branch of the current mirror receives the signal current at the drain of transistor M4 at the source of transistor M8 within the output branch. Transistor M8 and resistance R6 form a current-inverting buffer, similar to transistor M5 and resistance R3 and transistor M6 and resistance R4. Accordingly, the output node O receives an inverted version of the signal current at the drain of transistor M4.

The four aforementioned output components are combined at the output node O. This linear combination constitutes the output signal current of the non-inverting amplifier A1. More specifically, at the output node O, a sum of the following three components is present: (1) the inverted and mirrored version of the signal current at the drain of transistor M1, (2) the mirrored version of the signal current at the drain of transistor M3, and (3) the inverted version of the signal current at the drain of transistor M4. In addition, this sum is subtracted from the inverted version of the signal current at the drain of transistor M2.

The output signal current of the non-inverting amplifier A1, which is single-ended, varies as a function of the differential signal voltage that is present between the inverting input − and the non-inverting input +. However, the output signal current may also vary as a function of the common mode component of the differential signal voltage. This phenomenon is due to an imbalance of the NMOS differential pair and an imbalance of the PMOS differential pair. The imbalance of a differential pair is generally expressed by means of an offset voltage. The imbalance of the NMOS differential pair causes a portion of a tail current, which the common source node receives, to be converted into a differential current, which is offset dependent. The imbalance of the PMOS differential pair causes a similar phenomenon. The current combining circuit CC transforms the offset-dependent differential currents from the NMOS differential pair and the PMOS differential pair into an offset output current. Any modulation of the offset output current will cause a signal component at the output node O.

The common mode component may modulate the offset output current. This modulation of the offset output current is substantially defined by tail-current providing circuits. A tail-current providing circuit is coupled between the common source node of the NMOS differential pair and signal ground. Another tail-current providing circuit is coupled between the common source node of the PMOS differential pair and the supply voltage line.

In the non-inverting amplifier A1 illustrated in FIG. 2, the tail-current providing circuits are formed by resistance R1 and resistance R2, respectively. As a result, the common mode component modulates the respective tail currents that the NMOS differential pair and the PMOS differential pair receive, to a relatively great extent. This corresponds with a so-called relatively poor common mode rejection ratio. Accordingly, the offset output current varies to relatively great extent with the common mode component. However, this is not a significant problem, as will be explained hereinafter.

Figure 3:
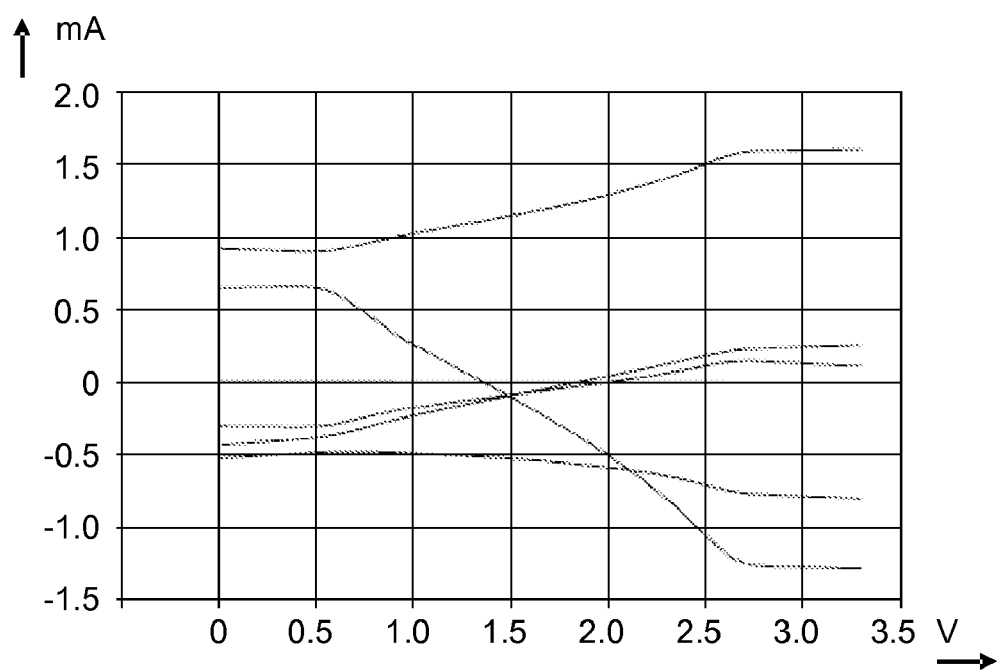
FIG. 3 is a graph that illustrates an offset output current of the amplifier as a function of a common mode input component for various offset voltages.

FIG. 3 illustrates modulation of the offset output current by the common mode component for various offset voltages, which have arbitrarily been chosen. FIG. 3 is a graph that comprises a horizontal axis, which represents the common mode component, and a vertical axis, which represents the offset output current. The graph comprises several curves. Each curve relates to a particular offset voltage that is deemed to be present between the inverting input − and the non-inverting input + of the non-inverting amplifier A1 illustrated in FIG. 2. The supply voltage was set to 3.3 volts.

FIG. 3 illustrates that the offset output current varies with the common mode component to relatively large extent. Stated otherwise, there is a relatively strong modulation of the offset output current in dependence on the common mode component. This is due to the fact that resistance R1 and resistance R3 constitute the tail-current providing circuits of the NMOS differential pair and the PMOS differential pair, respectively, as discussed hereinbefore.

More importantly, the offset output current varies with the common mode component in a substantially linear fashion over a relatively large voltage range between 0.6 and 2.6 volts. That is, the function in accordance with which the output signal current varies with the common mode component is substantially linear over a relatively large range. This is due to the fact that the respective tail currents of the NMOS differential and the PMOS differential pair vary with the common mode component in a substantially linear fashion. The use of resistances as tail-current providing circuits accounts for this. Nonetheless, other circuits may equally provide a linear relationship between the common mode component and the respective tail currents.

It is recalled that the common mode component corresponds with the input signal IS of the signal processor PRC illustrated in FIG. 1. It should further be noted that any distortion component in the offset output current will also be present in the output signal current. As long as the input signal IS is within a voltage range between 0.6 and 2.6 volts, the offset output current will be substantially free of distortion. No clipping will occur in this voltage range, which can be understood from FIG. 3. The non-inverting amplifier A1 is thus capable of handling the input signal IS in a distortion-free manner up to a voltage swing approximately 1.6 volts.

Let it be assumed that the non-inverting amplifier A1 is modified in the following manner. Resistance R1 is replaced by a transistor current source. Resistance R2 is equally replaced by a transistor current source. The thus modified non-inverting amplifier A1 substantially corresponds with the prior art amplifier discussed in the section "background of the invention" and will therefore be referred to as prior art amplifier hereinafter. The prior art amplifier will equally provide an offset output current.

Figure 4:
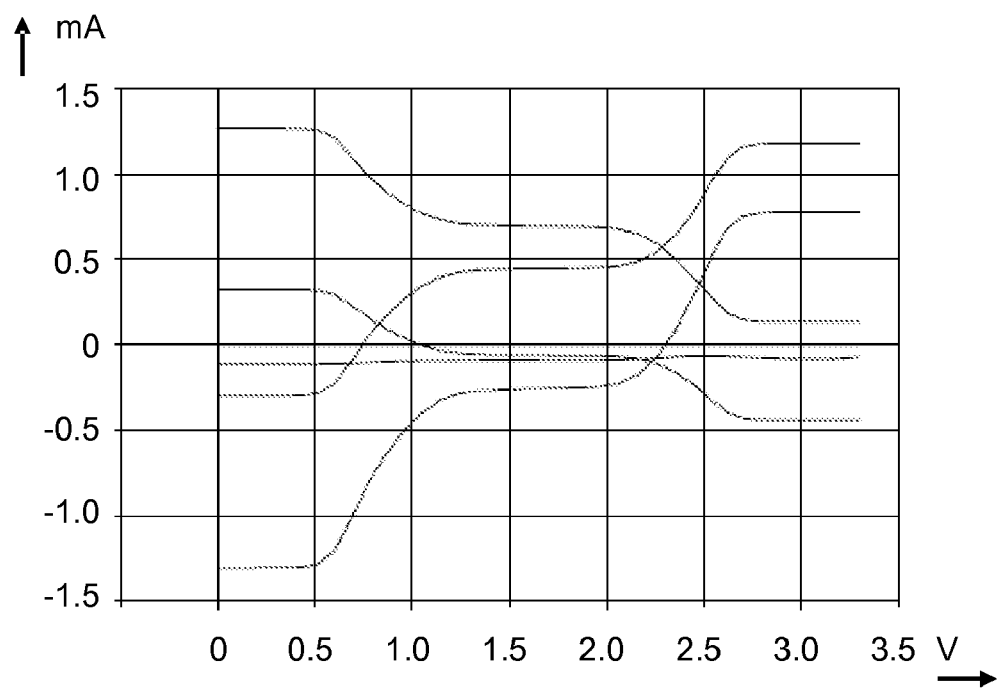
FIG. 4 is a similar graph that applies to a conventional amplifier.

FIG. 4 illustrates modulation by the common mode component of the offset output current that the prior art amplifier provides. This modulation is illustrated for various offset voltages, which have arbitrarily been chosen, similar to FIG. 3. FIG. 4 is a graph similar to that of FIG. 3. The supply voltage was equally set to 3.3 volts.

FIG. 4 illustrates that the offset output current varies with the common mode component to relatively small extent in a voltage range between 1.2 and 2.0 volts. Stated otherwise, in this voltage range, there is a relatively weak modulation of the offset output current in dependence on the common mode component. This is due to the fact that transistor current sources constitute the tail-current providing circuits of the NMOS differential pair and the PMOS differential pair. The transistor current sources provide a relatively good common mode rejection ratio.

However, the offset output current significantly varies with the common mode component outside the voltage range between 1.2 and 2.0 volts. There are jumps, as it were, in the curves illustrated in FIG. 4. These jumps are due to the following phenomenon. A transistor current source behaves as a non-linear impedance if there is a relatively low voltage across the transistor current source. In the prior art amplifier, this situation occurs when the common mode component is below 1.2 volts or above 2.0 volts. Accordingly, the tail current will vary with the common mode component in a substantially nonlinear fashion outside the voltage range between 1.2 and 2.0 volts.

The function in accordance with which the offset output current of the prior art amplifier varies with the common mode component, is substantially non-linear over the voltage range between 0.6 and 2.6 volts, which was mentioned hereinbefore in connection with FIG. 3. In case the input signal IS has a voltage swing that exceeds 0.8 volts, the offset output current will be distorted due to clipping. This clipping, which occurs at the jumps in the curves, will introduce a distortion component in the output signal current of the prior art amplifier.

The distortion component, which is caused by the clipping of the offset output current, has a magnitude that depends on the degree of imbalance in the NMOS differential pair and in the PMOS differential pair, which is expressed by means of the offset voltage. In principle, it is therefore possible to guarantee that the distortion component is below a given critical level by implementing the aforementioned differential pairs DP1, DP2 so that the degree of imbalance is below a corresponding critical level. In applications where distortion requirements are stringent, the prior art amplifier will therefore need to be implemented with relatively precise manufacturing techniques or with relatively large transistors, or both, which entails relatively high cost. Boldly stated, achieving relatively low distortion is a costly affair, if prior art techniques are used.

In contrast, the non-inverting amplifier A1 illustrated in FIG. 2 allows relatively low distortion at relatively modest cost. This is because the offset output current varies with the common mode component in a substantially linear manner, as illustrated in FIG. 3. Consequently, the degree of imbalance that can be tolerated with respect to distortion is significantly higher compared with the degree of imbalance that can be tolerated in the prior art amplifier. This is particularly true for input signals that have relatively large voltage swing.

CONCLUDING REMARKS OF THE INVENTION

The detailed description hereinbefore with reference to the drawings is merely an illustration of the invention and the additional features, which are defined in the claims. The invention can be implemented in numerous different manners. In order to illustrate this, some alternatives are briefly indicated.

The invention may be applied to advantage in any type of product or method in which a signal is amplified. The signal rendering system RSY illustrated in FIG. 1 is merely an example. The invention may equally be applied to advantage in, for example, a communication apparatus such as, for example, a cellular phone, a set-top box, or a personal digital assistant.

There are numerous ways of implementing an amplifier in accordance with the invention. Referring to FIG. 2, resistance R1 and resistance R2 may each be implemented by means of an active circuit that is configured to behave as a resistance. Accordingly, the respective tail currents will vary with the common mode component in a substantially linear fashion over a relatively wide voltage range. It should further be noted that an implementation may comprise transistors of the field effect type or bipolar transistors, or a combination of these types of transistors.

More specifically, there are numerous ways of implementing a current combining circuit. FIG. 2 illustrates an implementation that provides a single-ended output current. Another implementation may provide a differential output current. The current combining circuit illustrated in FIG. 2 comprises a current-inverting buffer formed by transistor M5 and resistance R3. In another implementation, resistance R3 may be replaced by an active current source that comprises at least one transistor. The same applies to resistance R4, which forms part of another, similar current-inverting buffer.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A signal processor comprising an amplifier comprising:
a pair of complementary differential pairs such that one differential pair comprises transistors having a polarity opposite to that of transistors in the other differential pair, the one and the other differential pair being coupled to commonly receive a differential input signal, which has a common mode component; and
a current combining circuit arranged to combine output currents of the one and the other differential pair so as to obtain an output current that varies as a function of the differential input signal,
the one and the other differential pair being each provided with a biasing circuit for providing a tail current that varies with the common mode component in a substantially linear fashion,
the current combining circuit comprising:
a pair of current-inverting buffers, each current-inverting buffer comprising an input node that is coupled to a first supply voltage line via a biasing circuit for applying a bias current to the input node, one and the other current-inverting buffer being coupled to receive an output current and a complementary output current, respectively, of one differential pair at their respective input nodes;
a current mirror for mirroring an output current of one current-inverting buffer, the current mirror comprising an input branch and an output branch, each branch including a transistor having a main terminal that is coupled to a second supply voltage line via an impedance, the input branch and the output branch being coupled to receive an output current and a complementary output current, respectively, of the other differential pair at the respective main terminals of the respective transistors, wherein the gate terminal of the transistor included in the input branch of the current mirror is coupled to the drain terminal of the transistor included in the input branch of the current mirror; and
an output node coupled to receive an output current of the other current-inverting buffer and coupled to receive an output current of the current mirror,
the amplifier being provided with a feedback circuit so that the differential input signal represents a difference between an input signal and an output signal of the amplifier.

2. A signal processor according to claim 1 whereby, in each differential pair, the biasing circuit that provides the tail current is a resistance.

3. A signal processor according to claim 1 whereby, in each aforementioned current-inverting buffer, the biasing circuit that applies the bias current to the input node is a resistance.

4. A signal processor according to claim 1, wherein each aforementioned current-inverting buffer comprises a transistor having a control terminal coupled to receive a bias voltage and a main terminal that constitutes the input node of the current-inverting buffer.

5. A signal processor according to claim 1, wherein the transistors are of CMOS type.

6. A signal rendering system comprising a signal source and a signal processor according to claim 1 for processing an input signal that the signal source provides so as to obtain an output signal that can be applied to a signal transducer.

7. The signal processor of claim 1, wherein the gate terminal of the transistor included in the input branch of the current mirror is directly coupled to the drain terminal of the transistor included in the input branch of the current mirror.

8. The signal processor of claim 1, wherein the signal processor further comprises:
an analog-to-digital converter connected to an output terminal of the amplifier;
a digital signal processor connected to an output terminal of the analog-to-digital converter;
a digital to analog converter connected to an output terminal of the digital signal processor; and
an output amplifier connected to an output terminal of the digital to analog converter.

9. The signal processor of claim 8, wherein the signal processor further comprises a second amplifier located in a signal path that is in parallel to the amplifier, and wherein the analog-to-digital converter is connected to an output terminal of the second amplifier.

10. The signal processor of claim 9, wherein the amplifier is a voltage follower, and wherein the second amplifier is an inverting amplifier.

11. The signal processor of claim 9, wherein output signals of the amplifier and the second amplifier constitute a differential input signal for the analog-to-digital converter.

12. The signal rendering system of claim 6, wherein the signal source includes a microphone, and wherein the signal transducer includes a loudspeaker.

13. A cellular phone comprising the signal processor of claim 1.

14. A signal rendering system comprising a signal source and a signal processor for processing an input signal that the signal source provides so as to obtain an output signal that can be applied to a signal transducer, wherein the signal processor comprises an amplifier comprising:
   a pair of complementary differential pairs such that one differential pair comprises transistors having a polarity opposite to that of transistors in the other differential pair, the one and the other differential pair being coupled to commonly receive a differential input signal, which has a common mode component; and
   a current combining circuit arranged to combine output currents of the one and the other differential pair so as to obtain an output current that varies as a function of the differential input signal,
   the one and the other differential pair being each provided with a biasing circuit for providing a tail current that varies with the common mode component in a substantially linear fashion,
   the current combining circuit comprising:
      a pair of current-inverting buffers, each current-inverting buffer comprising an input node that is coupled to a first supply voltage line via a biasing circuit for applying a bias current to the input node, one and the other current-inverting buffer being coupled to receive an output current and a complementary output current, respectively, of one differential pair at their respective input nodes;
      a current mirror for mirroring an output current of one current-inverting buffer, the current mirror comprising an input branch and an output branch, each branch including a transistor having a main terminal that is coupled to a second supply voltage line via an impedance, the input branch and the output branch being coupled to receive an output current and a complementary output current, respectively, of the other differential pair at the respective main terminals of the respective transistors, wherein the gate terminal of the transistor included in the input branch of the current mirror is coupled to the drain terminal of the transistor included in the input branch of the current mirror; and
      an output node coupled to receive an output current of the other current-inverting buffer and coupled to receive an output current of the current mirror.

15. The signal rendering system of claim 14, wherein the signal source includes a microphone, and wherein the signal transducer includes a loudspeaker.

16. A signal processor comprising an amplifier comprising:
   a pair of complementary differential pairs such that one differential pair comprises transistors having a polarity opposite to that of transistors in the other differential pair, the one and the other differential pair being coupled to commonly receive a differential input signal, which has a common mode component; and
   a current combining circuit arranged to combine output currents of the one and the other differential pair so as to obtain an output current that varies as a function of the differential input signal,
   the one and the other differential pair being each provided with a biasing circuit for providing a tail current that varies with the common mode component in a substantially linear fashion,
   the current combining circuit comprising:
      a pair of current-inverting buffers, each current-inverting buffer comprising an input node that is coupled to a first supply voltage line via a biasing circuit for applying a bias current to the input node, one and the other current-inverting buffer being coupled to receive an output current and a complementary output current, respectively, of one differential pair at their respective input nodes;
      a current mirror for mirroring an output current of one current-inverting buffer, the current mirror comprising an input branch and an output branch, each branch including a transistor having a main terminal that is coupled to a second supply voltage line via an impedance, the input branch and the output branch being coupled to receive an output current and a complementary output current, respectively, of the other differential pair at the respective main terminals of the respective transistors, wherein the gate terminal of the transistor included in the input branch of the current mirror is coupled to the drain terminal of the transistor included in the input branch of the current mirror; and
      an output node coupled to receive an output current of the other current-inverting buffer and coupled to receive an output current of the current mirror,
   wherein the signal processor further comprises:
      an analog-to-digital converter connected to an output terminal of the amplifier;
      a digital signal processor connected to an output terminal of the analog-to-digital converter;
      a digital to analog converter connected to an output terminal of the digital signal processor; and
      an output amplifier connected to an output terminal of the digital to analog converter.

17. The signal processor of claim 16, wherein the signal processor further comprises a second amplifier located in a signal path that is in parallel to the amplifier, and wherein the analog-to-digital converter is connected to an output terminal of the second amplifier.

18. The signal processor of claim 17, wherein the amplifier is a voltage follower, and wherein the second amplifier is an inverting amplifier.

19. The signal processor of claim 17, wherein output signals of the amplifier and the second amplifier constitute a differential input signal for the analog-to-digital converter.

20. A cellular phone comprising the signal processor of claim 16.

* * * * *